United States Patent

Au et al.

[11] Patent Number: 6,008,689
[45] Date of Patent: Dec. 28, 1999

[54] BODY GRABBING SWITCH

[75] Inventors: Stephen C. Au, Mountain View; David Maes, Santa Clara; Chowdhury F. Rahim, Saratoga, all of Calif.

[73] Assignee: Maxim Integrated Products, Inc., Sunnyvale, Calif.

[21] Appl. No.: 09/086,977

[22] Filed: May 28, 1998

[51] Int. Cl.[6] .................................................... H03K 3/01
[52] U.S. Cl. ........................................... 327/534; 327/404
[58] Field of Search .................................. 327/534, 403, 327/404, 535, 537

[56] References Cited

U.S. PATENT DOCUMENTS

| | | | |
|---|---|---|---|
| 5,396,128 | 3/1995 | Dunning et al. | 326/68 |
| 5,461,338 | 10/1995 | Hirayama et al. | 327/534 |
| 5,576,635 | 11/1996 | Partovi et al. | 326/27 |
| 5,703,522 | 12/1997 | Arimoto et al. | 327/534 |
| 5,748,016 | 5/1998 | Kurosawa | 327/108 |
| 5,854,569 | 12/1998 | Kohno et al. | 327/543 |

Primary Examiner—Toan Tran
Assistant Examiner—Anh-Quan Tra
Attorney, Agent, or Firm—Hickman Stephens & Coleman, LLP

[57] ABSTRACT

The present invention provides a switch circuit having a switch and a first body grabbing circuit. The switch includes a first transistor and a second transistor. The first transistor has a body and is coupled to the second transistor in parallel to form a common source and a common drain. The common source defines an input node and the common drain defines an output node. The first body grabbing circuit is coupled to the body of the first transistor. The first body grabbing circuit is arranged to couple the body of the first transistor to the input node when the first and second transistors receive a turn-on voltage signal such that a body effect is eliminated in the first transistor.

43 Claims, 7 Drawing Sheets

BODY GRABBING SWITCH

FIELD OF THE INVENTION

The present claimed invention relates to the field of CMOS switches. More particularly, the present claimed invention relates a circuit that eliminates body effect in CMOS switches.

BACKGROUND ART

Integrated circuit (IC) chips are used and incorporated in virtually every segment of modern electronic and computer products. For example, modern products such as computers, telephones, electronic goods, etc. typically include one or more IC chips. As is well known in the art, the IC chips often include switched capacitor circuits, which are used to realize many analog and mixed-signal circuits including filters, data converters, communication circuits, etc.

One of the main elements of a switched capacitor circuit is a switch. In an IC chip setting, complementary metal-oxide semiconductor (CMOS) switches are often used to take advantage of their high speed, small sizes, and zero turn-on voltage drop. Prior Art FIG. 1 illustrates a conventional CMOS switch 100 that can be used in an IC chip. The conventional CMOS switch 100 includes a n-channel MOS (NMOS) transistor M1 and a p-channel MOS (PMOS) transistor M2. The NMOS transistor M1 and the PMOS transistor M2 are coupled to each other in parallel at the common source node 102 and at the common drain node 104. When activated, the CMOS switch 100 receives an input signal Vin at the node 102 and transmits the Vin as an output signal Vout at the node 104.

In order to activate the CMOS switch 100, the gate of the NMOS transistor M1 is coupled to a supply voltage rail Vdd and the gate of the PMOS transistor M2 is coupled to the ground potential. The body (e.g., substrate or bulk) of the transistor M1 is tied to the ground potential while the body of the transistor M2 is tied to the supply voltage Vdd. The transistors M1 and M2 are coupled to each other at the source and drain nodes 102 and 104.

When designed with standard transistor components, the CMOS switch 100 properly functions with a supply voltage Vdd of 5 V or greater. However, today's IC chips increasingly employ lower supply voltages (e.g., 3 V) than 5 V as the feature sizes continuously shrink in an IC chip. The use of the lower power supply saves power and thus is advantageous in many applications including mobile computing and communication fields.

Unfortunately, the use of a lower supply voltage such as 3 V in the CMOS switch setting presents a persistent body effect (e.g., back gate bias effect) that may adversely affect the switching of the transistors M1 and M2. Specifically, at a low supply voltage, the transistors M1 and M2 in the CMOS switch 100 may not turn on properly due to the lower gate overdrive combined with the body effect in the transistors M1 and M2. Body effect occurs in an MOS transistor when the body is at a different potential than the source/drain such that a reverse biased junction is formed between the source/drain and the body (i.e., substrate) of the transistor. The reversed biased PN junctions cause a depletion region to form around the associated drain or the source.

For example, as the substrate or body (e.g., p-type silicon) of an NMOS transistor is made more negative relative to the source or drain (e.g., n-type silicon) of the transistor, the depletion region between the substrate and the source/drain experiences a larger potential drop and thus becomes thicker. Accordingly, in order to turn on the transistor, a higher voltage must be applied at the gate of the NMOS transistor to overcome the larger depletion region. The net result of the body effect is the apparent increase in the effective threshold voltage $V_{TH,NMOS}$ of the NMOS transistor as the reverse bias between the substrate and the source or drain is increased. Similarly, the effective threshold voltage $|V_{TH,PMOS}|$ of a PMOS transistor will increase if its body (e.g., n-type silicon) is at a higher potential than its source or drain (e.g., p-type silicon).

By way of example, the transistors M1 and M2 in CMOS switch 100 without body effect are characterized by a threshold voltage $V_{TH}=V_{TH,NMOS}=|V_{TH,PMOS}|=0.8$ volts. If the body effect is assumed to add 0.5 volt, the apparent threshold voltage VTH of the transistors M1 and M2 is 1.3 volt (0.8+0.5 volt). With a 3 V supply voltage Vdd and the voltages at the input and output nodes at about 1.5 volts (i.e., Vdd/2), the margin between the apparent threshold voltage and the gate-to-source voltage Vgs (e.g., gate overdrive) is only 0.2 volt. With such a narrow margin, the CMOS switch 100 will not operate reliably. Furthermore, the supply voltage of the 3 V rated supply voltage Vdd may actually fluctuate between 2.7 V to 3.3 V. When the supply voltage is at 2.7 V, the voltage margin decreases even more. Accordingly, the transistors M1 and M2 may not turn on properly.

One obvious solution to the switching problem caused by the body effect is to use a higher supply voltage. For example, higher supply voltages such as 5 V overcome the body effect by applying a high gate voltage that compensates for the body effect. Another technique uses a special clock booster or charge pump circuit to provide a larger gate overdrive to the affected transistors. Unfortunately, such circuits create internal voltage much higher than the supply voltage. Consequently, these circuits typically require special high-voltage transistor structures. However, the standard sub-micron commercial silicon processes usually do not implement such structures due to higher fabrication cost. Additionally, the small transistor size in such processes means that the regular transistors will have relatively low breakdown voltage.

Another solution may employ low-threshold transistors having threshold voltages of, for example, 0.3 to 0.4 volt, to overcome the body effect. This solution, however, is more costly since low-threshold voltage transistors require extra process steps. However, most commercial CMOS processes typically do not have this option. Moreover, the low-threshold voltage transistors have significant current leakage through them even when they are turned off.

Thus, what is needed is a circuit and method for switching a CMOS switch at low supply voltages without requiring costly and complex circuit structures. What is also needed is a circuit and method that eliminates the body effect in a transistor used in a CMOS switch.

SUMMARY OF THE INVENTION

Broadly speaking, the present invention fills these needs by providing a circuit that allows switch conduction at low supply voltage by eliminating the body effect. It should be appreciated that the present invention can be implemented in numerous ways, including as a process, an apparatus, a system, a device, or a method. Several inventive embodiments of the present invention are described below.

In one embodiment, the present invention provides a switch circuit. The switch circuit includes a switch and a first body grabbing circuit. The switch includes a first transistor and second transistor. The first transistor has a body and is coupled to the second transistor in parallel to form a common source and a common drain. The common source defines an input node and the common drain defines an output node. The first body grabbing circuit is coupled to the body of the first transistor. The first body grabbing circuit is arranged to couple the body of the first transistor to the input node when the first and second transistors receive a turn-on voltage signal such that a first body effect is eliminated in the first transistor.

In another embodiment, a switch circuit includes first and second switching means, and first body coupling means. The first and second switching means are arranged to transmit an input signal to an output node. The first switching means has a body. The switching means receives the input signal at an input node. The first and second switching means are coupled at the input and output nodes. The first body coupling means is arranged to couple the body of the first switching means to the input node when the first and second switching means receive a turn-on voltage signal such that a first body effect on the first switching means is substantially eliminated.

In yet another embodiment, the present invention provides a method for eliminating body effect on a first transistor having a body, a source, drain, and a gate. The method includes (a) receiving an input signal at the source; (b) applying a first voltage to the first transistor; (c) coupling the body of the first transistor to the input node such that the voltage at the body of the first transistor is at the same voltage as the source of the first transistor; and (d) taking an output voltage at the drain of the first transistor.

Advantageously, the present invention eliminates body effect in a transistor by tying the body to the source and/or the drain of the transistors when the CMOS switch is to be turned on. This tying or grabbing of the body to the source and/or the drain makes the transistor easier to turn on by allowing switch conductance even when the supply voltage is low. In addition, the body grabbing circuit of the present invention provides channel conductance for the full range of supply voltage without requiring a clock booster or charge pump. Furthermore, since the body grabbing circuit does not require a high gate-overdrive voltage, it provides low risk of failure in modern sub-micron silicon process. Other aspects and advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

DESCRIPTION OF THE PREFERRED EMBODIMENTS

In the following detailed description of the present invention, a body grabbing circuit and a method therefor, numerous specific details are set forth in order to provide a thorough understanding of the present invention. However, it will be obvious to one skilled in the art that the present invention may be practiced without these specific details. In other instances, well known methods, procedures, components, and circuits have not been described in detail so as not to unnecessarily obscure aspects of the present invention.

The present invention provides a body grabbing switch in a CMOS switch circuit. The body grabbing switch eliminates the body effect in one or more MOS transistors in the CMOS switch by tying the body to the source and/or the drain of the transistors when the CMOS switch is to be turned on. This tying or grabbing of the body to the source and/or the drain makes the transistor easier to turn on by allowing switch conductance even when the channel of the transistor is close to mid-supply voltage.

Figure 1:
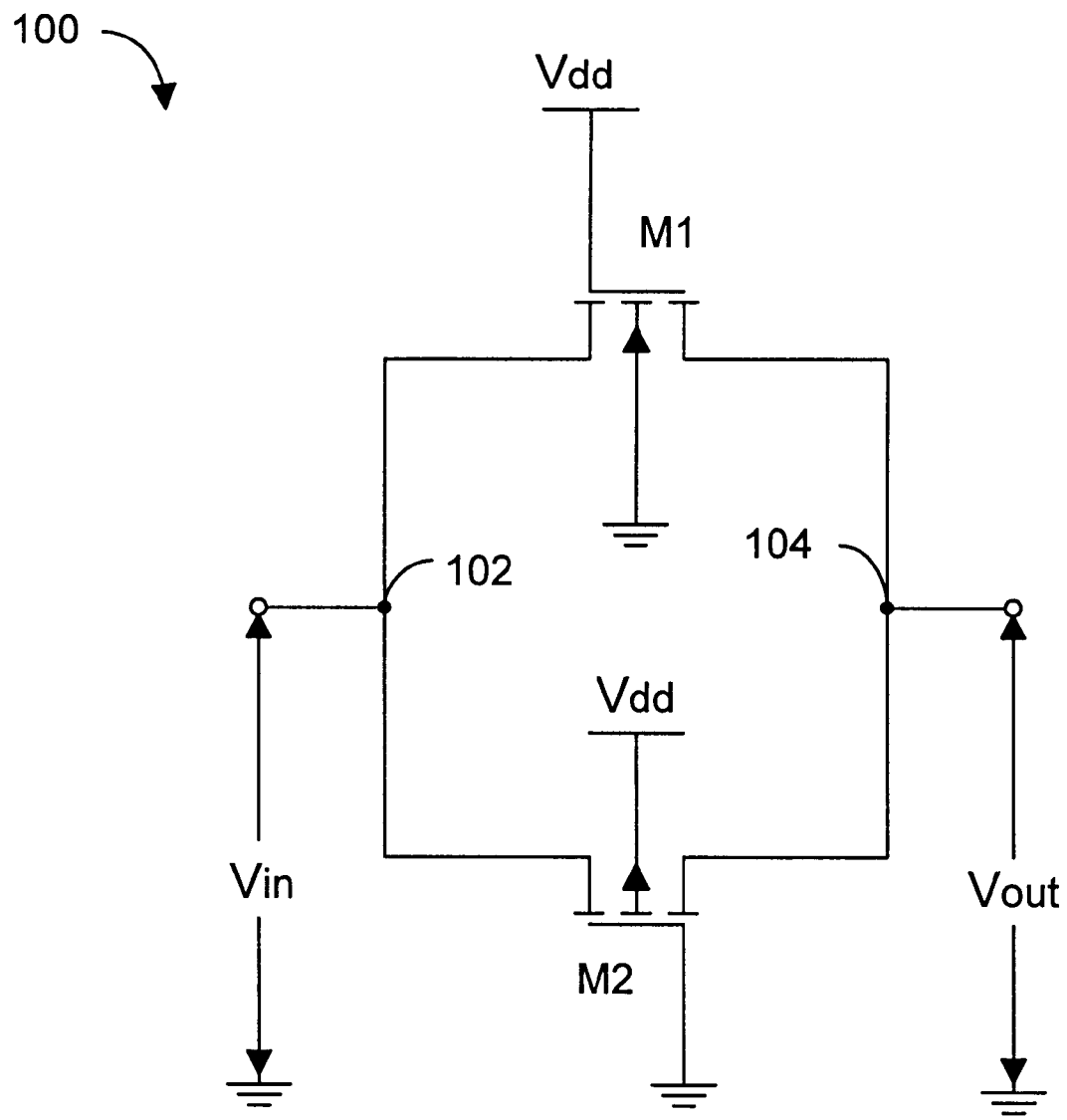
FIG. 1 illustrates a conventional CMOS switch that can be used in an IC chip.
Figure 2A:
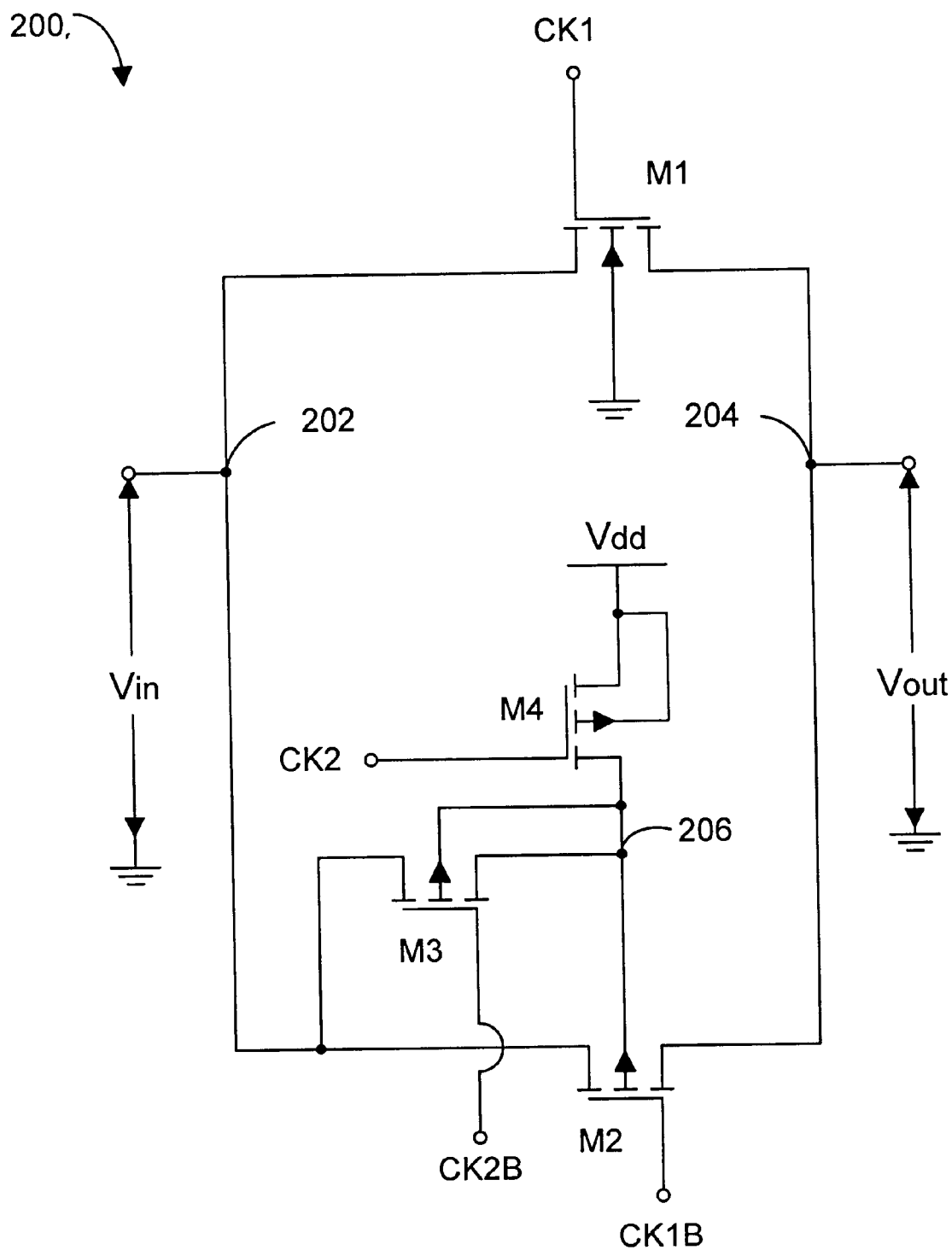
FIG. 2A illustrates a CMOS switch including a body grabbing circuit that ties a body of a PMOS transistor in accordance with one embodiment of the present invention.

FIG. 2A illustrates a CMOS switch 200 including a body grabbing circuit that ties a body of a transistor in accordance with one embodiment of the present invention. The CMOS switch 200 includes NMOS transistor M1 and PMOS transistor M2. The transistors M1 and M2 are coupled at a common source node 202 and a common drain node 204. An input voltage signal, Vin, is provided at the common source node 202, which is also an input node. The CMOS switch 200 outputs an output voltage signal, Vout, at the common drain node 204, which is also an output node.

The gate of the NMOS transistor M1 receives an input voltage signal CK1 while the body is tied to a ground potential. The gate of the PMOS transistor M2 receives an input voltage signal CK1B. The body of the transistor M2 is coupled to a supply voltage rail Vdd through the transistor M4 in the body grabbing circuit.

The body grabbing circuit in FIG. 2A includes a pair of PMOS transistors M3 and M4. The transistor M4 is coupled between the body of the transistor M2 and the supply voltage rail Vdd. More specifically, the drain of the transistor M4 is coupled to the body of the transistor M2 at node 206 and the source is coupled to the supply voltage rail Vdd. The body and the source of the transistor M4 are coupled to each other and to the supply voltage rail Vdd. The transistor M4 receives an input signal CK2 at the gate.

The other transistor M3 of the body grabbing circuit is coupled between the body of the transistor M2 at node 206 and the input node 202. More specifically, the source and the body of the transistor M3 are coupled to the body of the transistor M2 at node 206 while the drain of the transistor M3 is coupled to the input node 202. The transistor M3 receives an input voltage signal CK2B at the gate.

Figure 2B:
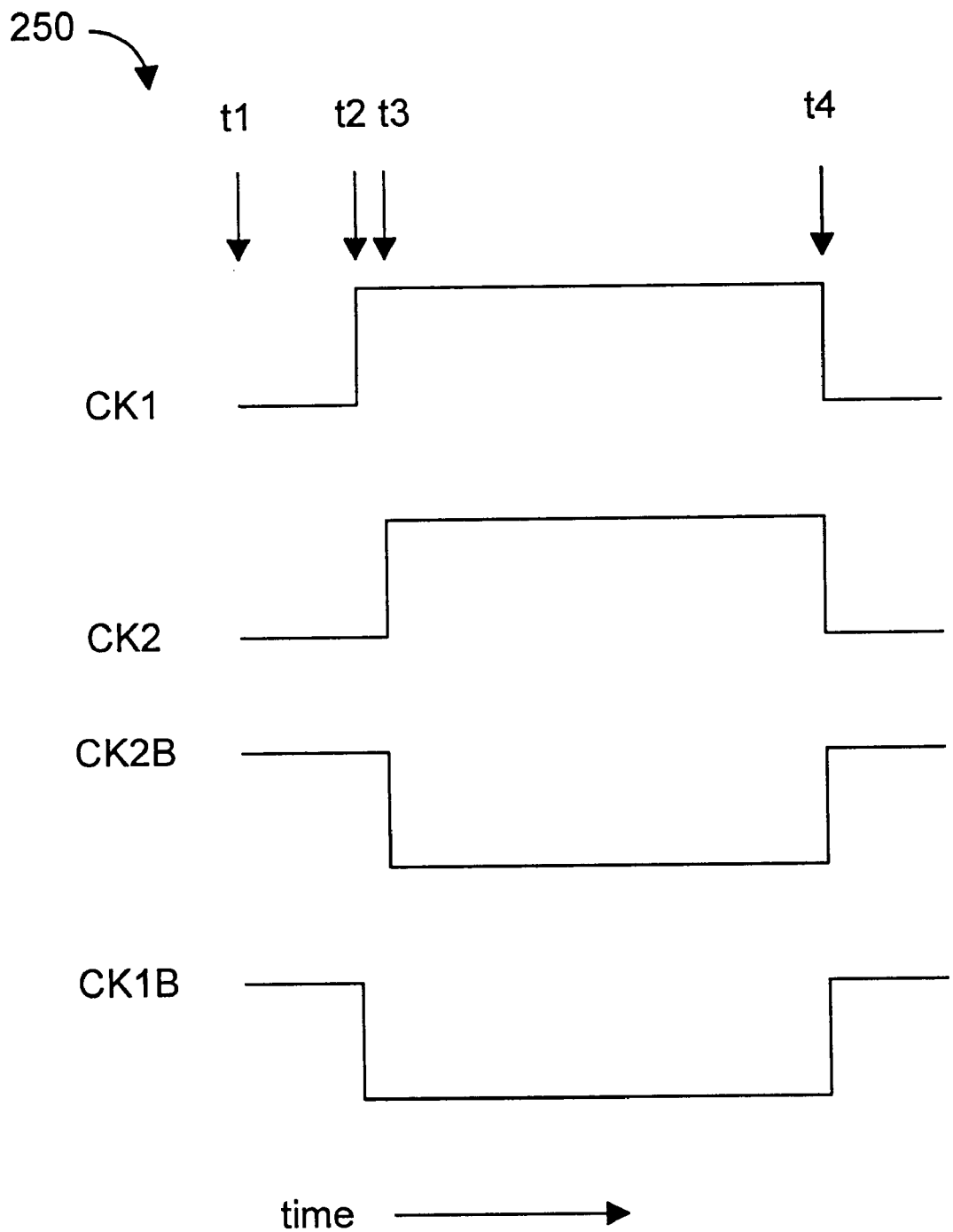
FIG. 2B illustrates a timing diagram of the CMOS switch of FIG. 2A in operation.

FIG. 2B illustrates a timing diagram 250 of the CMOS switch 200 in operation. The transistors M1, M2, M3, and M4 operate in response to input gate voltages CK1, CK1B, CK2B, and CK2, respectively. It should be appreciated that the input gate voltages CK1, CK1B, CK2B, and CK2 are measured and discussed in reference to the ground potential.

Initially at time t1, the gate input voltage signal CK1 of the transistor M1 is low (e.g., ground potential) and the gate input voltage signal CK1B of the transistor M2 is high (e.g., at supply voltage Vdd). In addition, the gate input voltage signal CK2B of the transistor M3 is high (e.g., at supply voltage Vdd). Hence, the transistors M1, M2, and M3 are off. The only transistor that is on is the transistor M4 with a low input voltage signal CK2. In this state, the transistor M4 pulls the voltage at the body node 206 to the supply voltage Vdd. Since the body of M1 is at ground potential and the body of the transistor M2 is at the supply voltage Vdd, the transistors M1 and M2 are both off. Accordingly the CMOS switch 200 is also in an off state.

At time t2, the CMOS switch 200 turns on. When the input gate voltage signal CK1 of the transistor M1 goes high up to the supply voltage Vdd (e.g., 3 V), the transistor M1 turns on. On the other hand, the gate input voltage signal CK1B of the transistor M2 goes low to the ground potential (e.g., 0 V). Hence, both transistors M1 and M2 are turned on. In this configuration, the body of the NMOS transistor M1 is at the ground potential while the body of the PMOS transistor M2 is still tied to the supply voltage Vdd. In this state, the transistors M1 and M2 will experience body effect as in conventional CMOS switch circuits.

At time t3, the gate input voltage signal CK2 of the transistor M4 rises from low (e.g., ground potential) to high (e.g., supply voltage). This voltage transition turns off the transistor M4. The input gate voltage of the transistor M3 in the body grabbing circuit, on the other hand, falls from high to low voltage (e.g., supply voltage to ground), thereby turning on the transistor M3. The switched on transistor M3 shorts the body node 206 of the transistor M2 to the input node 202.

In effect, the transistor M3 ties or "grabs" (i.e., couples) the body of the transistor M2 to the input voltage Vin instead of supply voltage rail Vdd. As a result, the body, source, and the drain of the transistor M2 have the same voltage. Accordingly, the PNjunctions in the transistor M2 are not reverse biased. The lack of reversed biased junction means that depletion regions will not form in the transistor, thereby effectively eliminating the body effect. Consequently, the effective threshold voltage $V_{TH}$ of the transistor M2 is lowered, thereby allowing the transistor to turn on more reliably and easily than in conventional CMOS switch transistors.

The preferred embodiment of the present invention provides a small delay between the time t2 and t3. Specifically, the input signals CK2 and CK2B change at time t3 after the input signals CK1 and CK1B have changed at time t2. This delay is preferably long enough to prevent possible latch-up that may result from a current flow from the drain to the body of the transistor M2.

In an alternative embodiment, t2 and t3 are the same. That is, the signals CK1, CK1B, CK2, and CK2B change simultaneously without a delay between t2 and t3. In one embodiment, the input signal CK2B follows the input signal CK2 after a short delay.

At time t4, the CMOS switch is turned off. Specifically, the input gate voltage signals CK1, CK1B, CK2, and CK2B return to the original offstate oftime t1. In this state, the transistor M3 is off and the transistor M4 is on. Accordingly, the body of the transistor M2 is tied back to the voltage supply rail Vdd. Preferably, the transistors M1 and M2 turn off after the transition of the transistors M3 and M4.

Figure 3A:
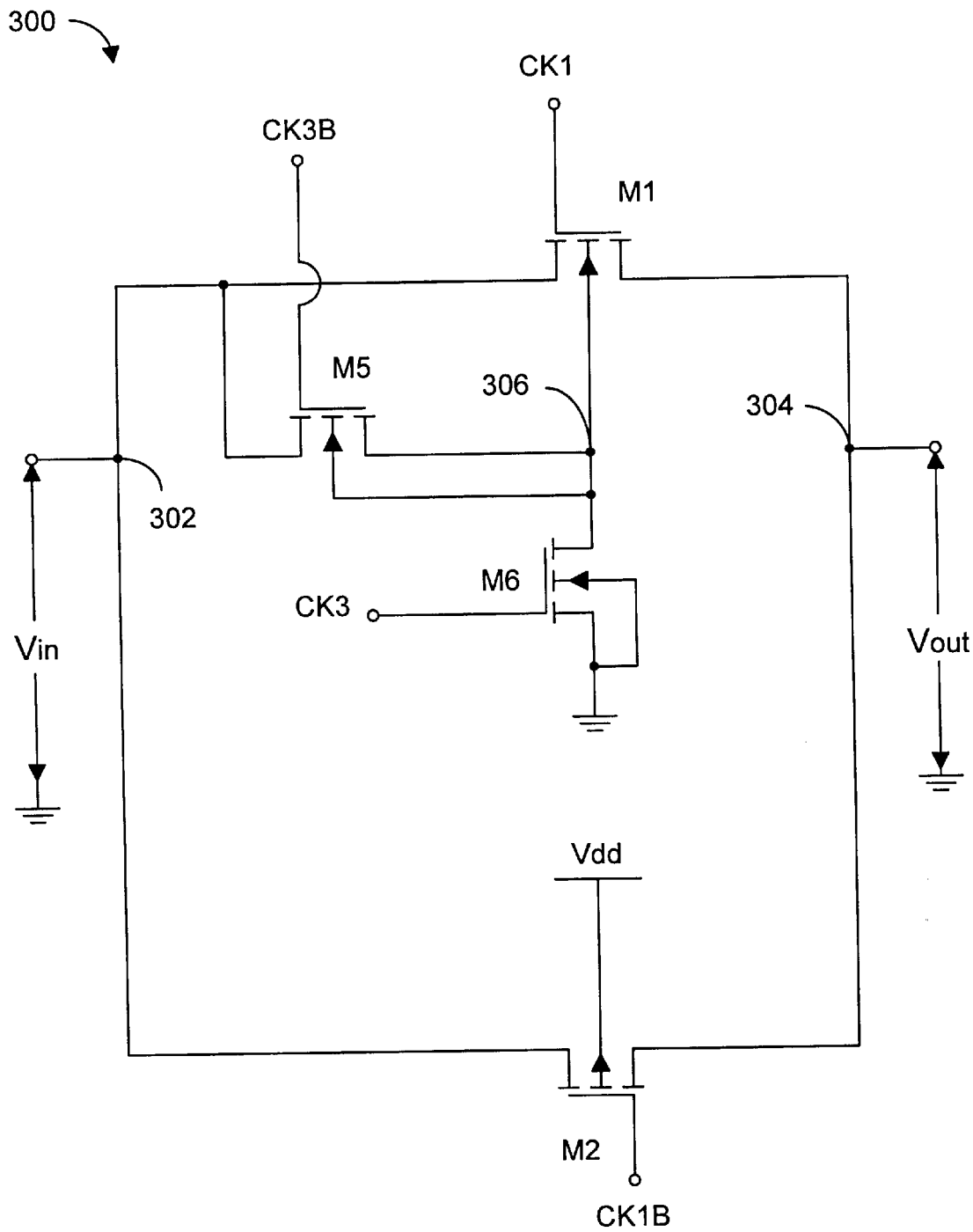
FIG. 3A illustrates a CMOS switch 300 including a body grabbing circuit that ties a body of an NMOS transistor in accordance with one embodiment of the present invention.

In accordance with another embodiment of the present invention, the body grabbing switch circuit may also be coupled to the body of an NMOS transistor in a CMOS switch. FIG. 3A illustrates a CMOS switch 300 including a body grabbing circuit that ties a body of an NMOS transistor in accordance with one embodiment of the present invention. Similar to the CMOS switch 200 of FIG. 2A, the CMOS switch 300 includes NMOS transistor M1 and PMOS transistor M2. The transistors M1 and M2 are coupled at a common source node 302 and a common drain node 304. An input voltage signal, Vin, is provided at the common source node 302, which serves as an input node. The CMOS switch 300 outputs an output voltage signal, Vout, at the common drain node 304, which serves as an output node.

The gate of the NMOS transistor M1 receives an input voltage signal CK1. The body of the transistor M1 is coupled to a ground potential through the transistor M6 in the body grabbing circuit. The gate of the PMOS transistor M2 receives an input voltage signal CK1B while the body is tied to a supply voltage rail Vdd.

The body grabbing circuit in FIG. 3A includes a pair of NMOS transistors M5 and M6. The transistor M6 is coupled between the body of the transistor M1 and the ground rail. That is, the drain of the transistor M6 is coupled to the body of the transistor M1 at node 306 and the source of the transistor M6 is coupled to the ground. The body and the source of the transistor M6 are coupled to each other and to the ground. The transistor M6 receives an input signal CK3 at its gate.

The other transistor M5 of the body grabbing circuit is coupled between the body of the transistor M1 at node 306 and the input node 302. More specifically, the source and the body of the transistor M5 are coupled to the body of the transistor M1 at node 306 while the drain of the transistor M5 is coupled to the input node 302. The transistor M5 receives an input voltage signal CK3B at its gate.

Figure 3B:
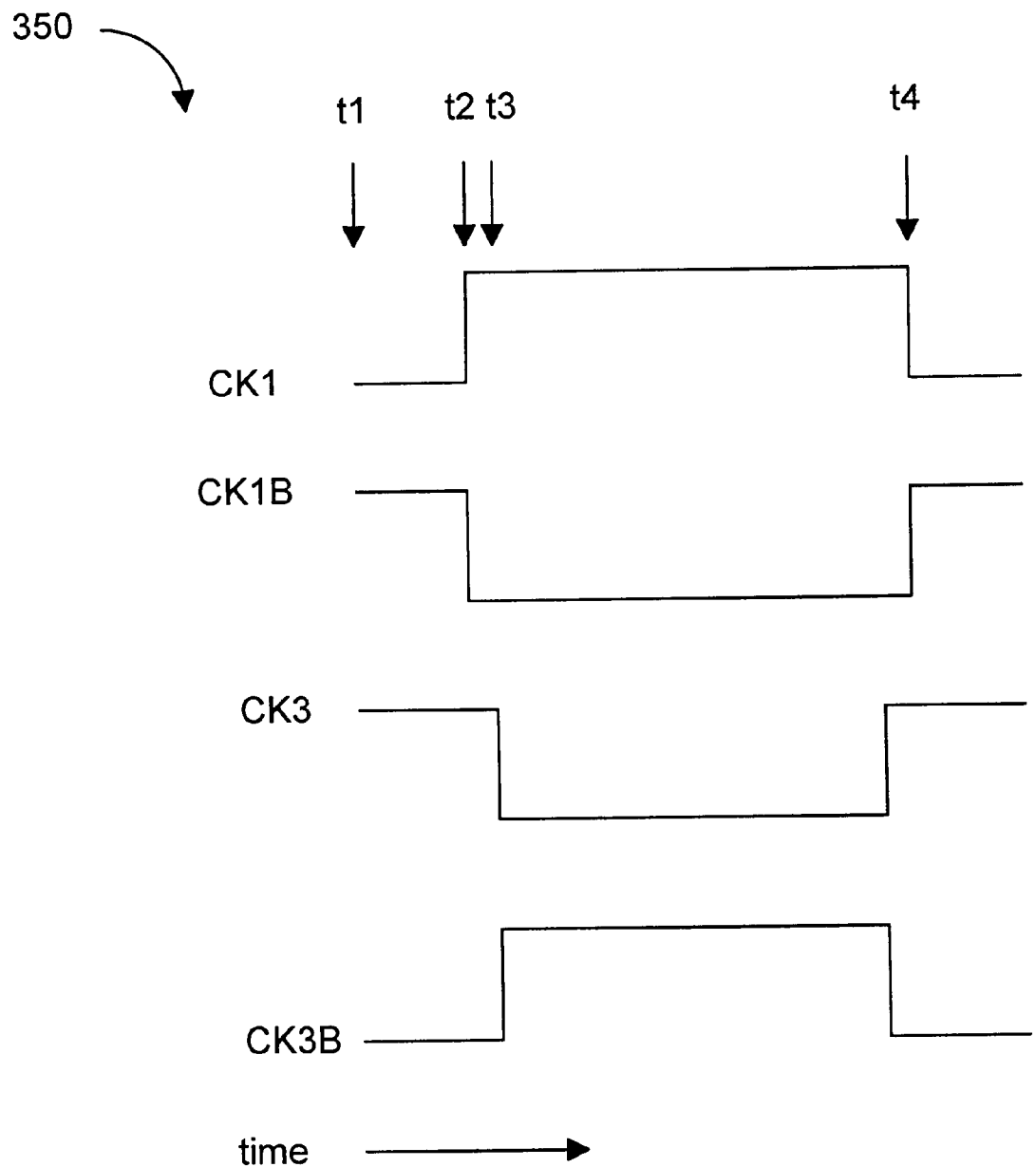
FIG. 3B illustrates a timing diagram of the CMOS switch of FIG. 3A in operation.

FIG. 3B illustrates a timing diagram 350 of the CMOS switch 300 in operation. The transistors M1, M2, M5, and M6 operate in response to input gate voltages CK1, CK1B, CK3B, and CK3, respectively. It should be appreciated that the input gate voltages CK1, CK1B, CK3B, and CK3 are measured and discussed in reference to the ground potential.

Initially at time t1, the gate input voltage signal CK1 of the transistor M1 is low (e.g., ground potential) and the gate input voltage signal CK1B of the transistor M2 is high (e.g., at supply voltage Vdd). In addition, the gate input voltage signal CK3B of the transistor M5 is low (e.g., at ground). Hence, the transistors M1, M2, and M5 are off. The only transistor that is on is the transistor M6 with a high input voltage signal CK3 (e.g., at supply voltage Vdd). In this state, the transistor M6 pulls the voltage at the body node 306 to the ground. Since the body of M1 is at ground potential and the body of the transistor M2 is at the supply voltage Vdd, the transistors M1 and M2 are both off. Accordingly the CMOS switch 300 is also at an off state.

At time t2, the CMOS switch 300 turns on. When the input gate voltage signal CK1 of the transistor M1 goes high up to the supply voltage Vdd (e.g., 3 V), the transistor M1 turns on. On the other hand, the gate input voltage signal CK1B of the transistor M2 goes low to the ground potential (e.g., 0 V). Hence, both transistors M1 and M2 are turned. In this configuration, the body of the NMOS transistor M1 is still at the ground potential while the body of the PMOS transistor M2 is tied to the supply voltage Vdd. In this state, the transistors M1 and M2 will experience body effect as in conventional CMOS switch circuits.

At time t3, the gate input voltage signal CK3 of the transistor M6 falls from high (e.g., supply voltage) to low (e.g., ground potential). This voltage transition turns off the transistor M4. The input gate voltage signal CK3B of the transistor M5 in the body grabbing circuit, on the other hand, rises from low to high voltage (e.g., ground to supply voltage), thereby turning on the transistor M5. The switched on transistor M5 shorts the body node 306 of the transistor M1 to the input node 302.

In effect, the transistor M5 ties or "grabs" the body of the transistor M1 to the input voltage Vin instead of supply voltage rail Vdd. As a result, the body, source, and the drain of the transistor M1 have the same voltage. Accordingly, the PN junctions in the transistor M1 are not reverse biased. The lack of reversed biased junction means that depletion regions will not form in the transistor, thereby effectively eliminating the body effect. Consequently, the effective threshold voltage $V_{TH}$ of the transistor M1 is lowered, thereby allowing the transistor to turn on more reliably and easily than in conventional CMOS switch transistors.

As with the CMOS switch 200 of FIG. 2A, the preferred embodiment of the CMOS switch 300 provides a small delay between the time t2 and t3. Specifically, the input signals CK3 and CK3B change at time t3 after the input signals CK1 and CK1B have changed at time t2. This delay is preferably long enough to prevent possible latch-up that may result from electrons flowing from the drain to the body of the transistor M1.

In an alternative embodiment, t2 and t3 are the same. That is, the signals CK1, CK1B, CK3, and CK3B change simultaneously without a delay between t2 and t3. In one embodiment, the input signal CK3B follows the input signal CK3 after a short delay.

At time t4, the CMOS switch 300 is turned off. Specifically, the input gate voltage signals CK1, CK1B, CK3, and CK3B return to the original off state of time t1. In this state, the transistors M5 is off and the transistor M6 is on. Accordingly, the body of the transistor M1 is tied back to the ground. Preferably, the transistors M1 and M2 turn off after the transition of the transistors M5 and M6.

Figure 4A:
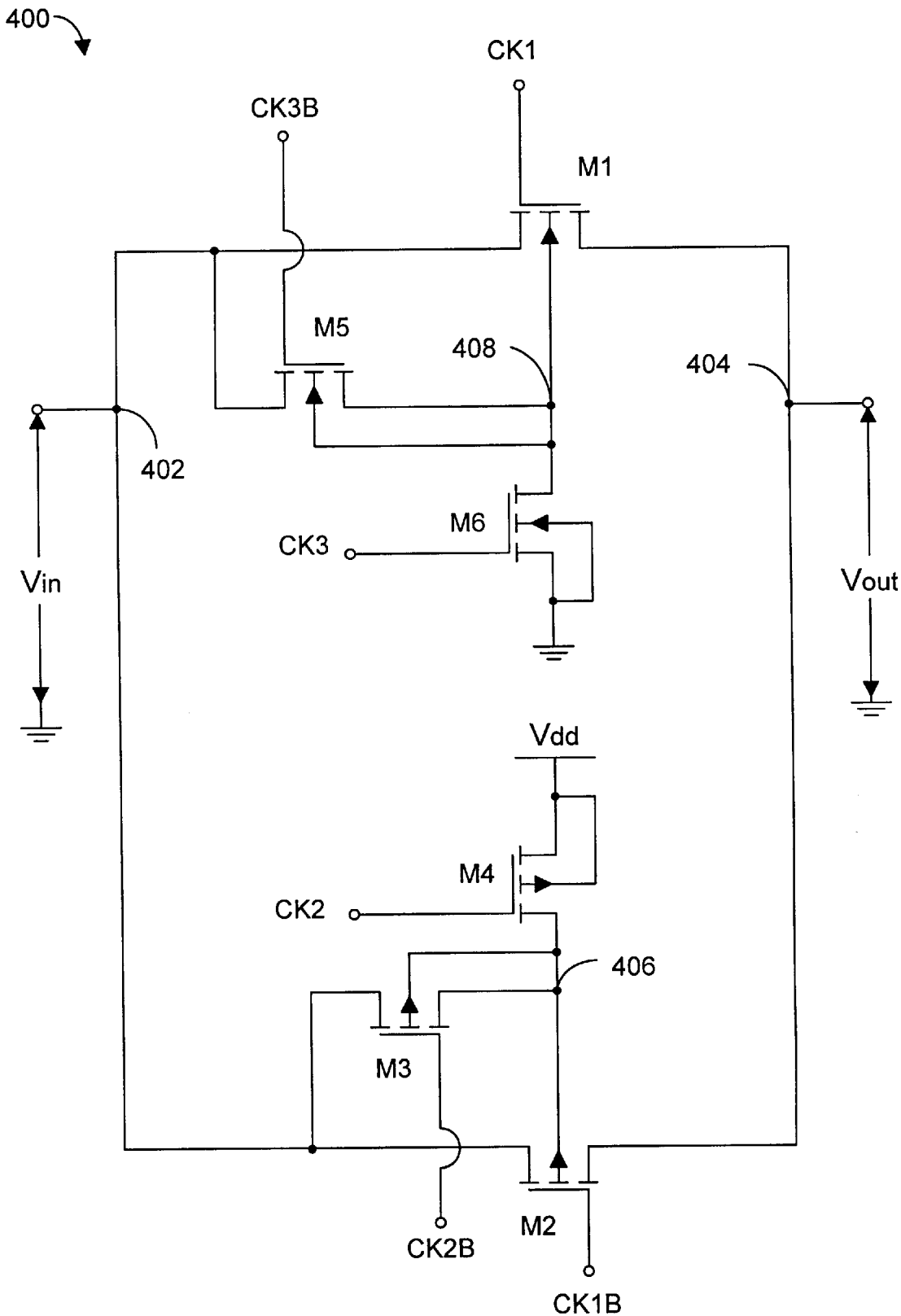
FIG. 4A illustrates a CMOS switch including a body grabbing circuit that ties the bodies of both transistors in the CMOS switch.

In accordance with another embodiment of the present invention, a body grabbing switch circuit may also be coupled to the body of each of the NMOS and PMOS transistors in a CMOS switch. FIG. 4A illustrates a CMOS switch 400 including a pair of body grabbing circuits that tie the bodies of NMOS and PMOS transistors in accordance with one embodiment of the present invention. Similar to the CMOS switches 200 and 300 of FIGS. 2A and 3A, the CMOS switch 400 includes NMOS transistor M1 and PMOS transistor M2. The transistors M1 and M2 are coupled at a common source node 402 and a common drain node 404. An input voltage signal, Vin, is provided at the common source node 402, which serves as an input node. The CMOS switch 400 outputs an output voltage signal, Vout, at the common drain node 404, which serves as an output node.

The gate of the PMOS transistor M2 receives an input voltage signal CK1B. The body of the transistor M2 is coupled to a supply voltage rail Vdd or the node 402 through a first body grabbing circuit that includes PMOS transistors M3 and M4. The gate of the NMOS transistor M1 receives an input voltage signal CK1. The body of the transistor M1 is coupled to a ground potential or the node 402 through a second body grabbing circuit that includes a pair of NMOS transistors M5 and M6.

The first body grabbing circuit in FIG. 4A includes a pair of PMOS transistors M3 and M4. The transistor M4 is coupled between the body of the transistor M2 and the supply voltage rail Vdd. More specifically, the drain of the transistor M4 is coupled to the body of the transistor M2 at node 406 and the source is coupled to the supply voltage rail Vdd. The body and the source of the transistor M4 are coupled to each other and to the supply voltage rail Vdd. The transistor M4 receives an input signal CK2 at the gate.

The other transistor M3 of the body grabbing circuit is coupled between the body of the transistor M2 at node 406 and the input node 402. More specifically, the source and the body of the transistor M3 are coupled to the body of the transistor M2 at node 406 while the drain of the transistor M3 is coupled to the input node 402. The transistor M3 receives an input voltage signal CK2B at the gate.

The second body grabbing circuit in FIG. 4A includes a pair of NMOS transistors M5 and M6. The transistor M6 is coupled between the body of the transistor M1 and the ground rail. That is, the drain of the transistor M6 is coupled to the body of the transistor M1 at node 408 and the source of the transistor M6 is coupled to the ground. The body and the source of the transistor M6 are coupled to each other and to the ground. The transistor M6 receives an input signal CK3 at its gate.

The other transistor M5 of the body grabbing circuit is coupled between the body of the transistor M1 at node 408 and the input node 402. More specifically, the source and the body of the transistor M5 are coupled to the body of the transistor M1 at node 408 while the drain of the transistor M5 is coupled to the input node 402. The transistor M5 receives an input voltage signal CK3B at its gate.

Figure 4B:
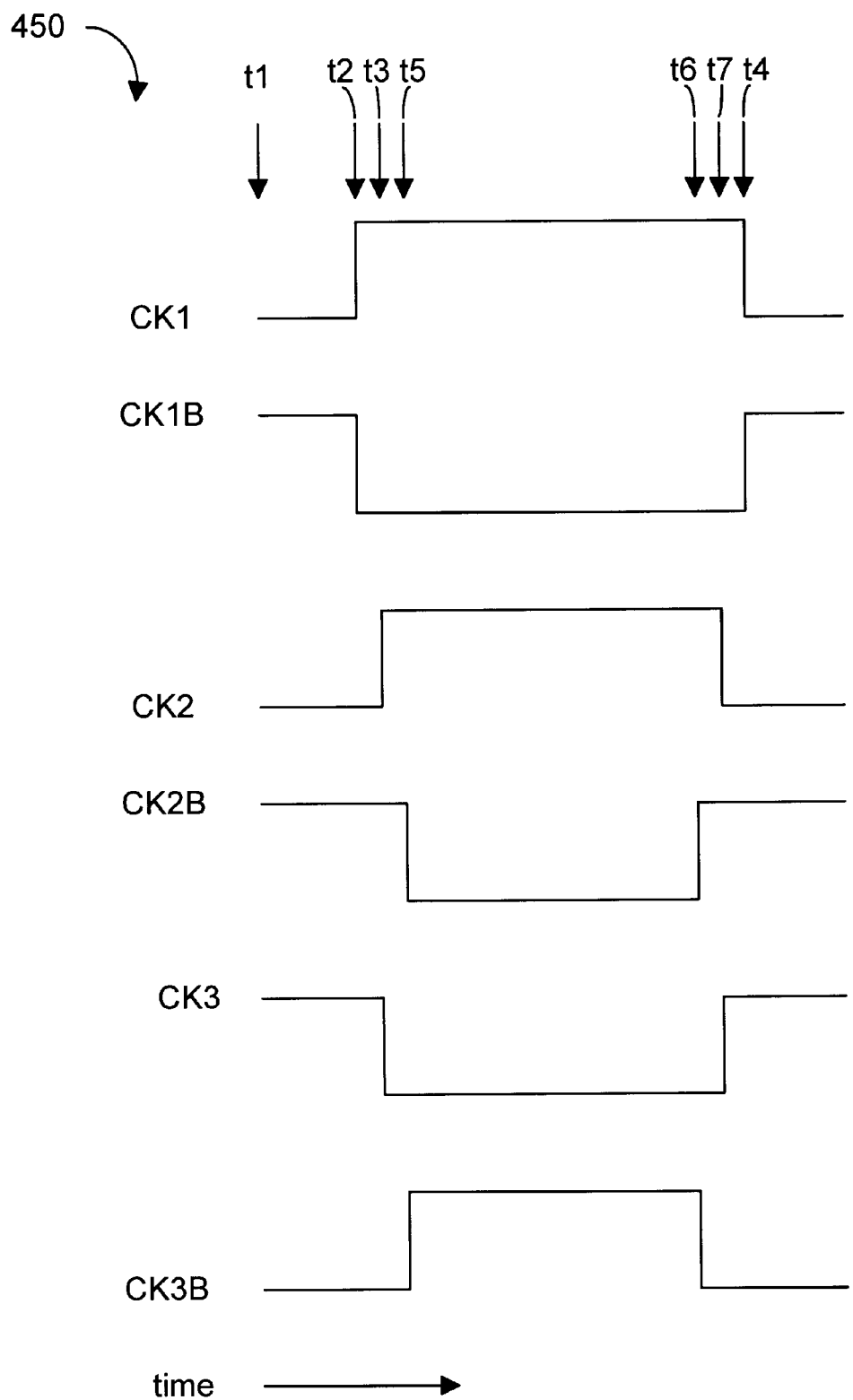
FIG. 4B illustrates a timing diagram of the CMOS switch of FIG. 4A in operation.

FIG. 4B illustrates a timing diagram 450 of the CMOS switch 400 in operation. The transistors M1, M2, M3, M4, M5, and M6 operate in response to input gate voltages CK1, CK1B, CK2B, CK2, CK3B, and CK3, respectively. The timing diagram 450 is a combination of the timing diagrams described above in conjunction with FIGS. 2B and 3B. Accordingly, the CMOS switch 400 operate in a similar manner as the CMOS switches 200 and 300 of FIGS. 2A and 3A.

It should be noted, however, that the timing diagram 450 shows delays between the time the signals CK2 and CK3 are changed and the time the signals CK2B and CK3B are changed. In particular, the timing diagram depicts a delay between time t3 and t5 and a delay between t6 and t7. Although the timing diagram shows these delays, it should be appreciated that the CMOS switch 400 may work without these delays.

Advantageously, the present invention eliminates body effect in a transistor by tying the body to the source and/or the drain of the transistors when the CMOS switch is to be turned on. This tying or grabbing of the body to the source and/or the drain makes the transistor easier to turn on by allowing switch conductance even when the supply voltage is low. In addition, the body grabbing circuit of the present invention provides channel conductance for the full range of supply voltage without requiring a clock booster or charge pump. Furthermore, since the body grabbing circuit does not require a high gate-overdrive voltage, it provides low risk of failure in modem sub-micron silicon process.

While the present invention has been described in terms of several preferred embodiments, there are alterations, permutations, and equivalents which fall within the scope of this invention. It should also be noted that there are alternative ways of implementing both the method and apparatus of the present invention. It is therefore intended that the following appended claims be interpreted as including all such alterations, permutations, and equivalents as fall within the true spirit and scope of the present invention.

What is claimed is:

1. A switch circuit comprising:
a switch including a first transistor and a second transistor, the first transistor having a body and being coupled to the second transistor in parallel to form a common source and a common drain, the common source defining an input node and the common drain defining an output node; and
a first body grabbing circuit coupled to the body of the first transistor and being arranged to couple the body of the first transistor to the input node when the first and second transistors receive a turn-on voltage signal such that a first body effect is eliminated in the first transistor.

2. A switch circuit comprising:
a switch including a first transistor and a second transistor, the first transistor having a body and being coupled to the second transistor in parallel to form a common source and a common drain, the common source defining an input node and the common drain defining an output node;
a first body grabbing circuit coupled to the body of the first transistor and being arranged to couple the body of the first transistor to the input node when the first and second transistors receive a turn-on voltage signal such that a first body effect is eliminated in the first transistor;
a third transistor coupled between the body of the first transistor and a first voltage level, the third transistor being arranged to couple the body of the first transistor to the first voltage level when the first transistor receives a turn-off voltage signal; and a fourth transistor coupled between the body of the first transistor and the input node, the fourth transistor being arranged to couple the body of the first transistor to the input node when the first transistor receives the turn-on voltage signal.

3. The switch circuit as recited in claim 2, wherein the second transistor has a body and wherein the switch circuit further comprises:
a second body grabbing circuit coupled to the body of the second transistor and being arranged to couple the body of the second transistor to the input node when the first and second transistors receive the turn-on voltage signal such that a second body effect is absent in the second transistor.

4. The switch circuit as recited in claim 3, wherein the second body grabbing circuit further comprises:
a fifth transistor coupled between the body of the second transistor and being arranged to couple the body of the second transistor to a second voltage level when the second transistor receives a turn-off voltage signal; and
a sixth transistor coupled between the body of the second transistor and the input node, the sixth transistor being arranged to couple the body of the second transistor to the input node when the second transistor receives the turn-on voltage signal.

5. The switch circuit as recited in claim 3, wherein the switch circuit is a CMOS switch circuit.

6. The switch circuit as recited in claim 3, wherein the first and second transistors are MOS transistors.

7. A switch circuit comprising:
a switch including a first transistor and a second transistor, the first transistor having a body and being coupled to the second transistor in parallel to form a common source and a common drain, the common source defining an input node and the common drain defining an output node; and
a first body grabbing circuit coupled to the body of the first transistor and being arranged to couple the body of the first transistor to the input node when the first and second transistors receive a turn-on voltage signal such that a first body effect is eliminated in the first transistor;
wherein the first transistor is an n-channel MOS transistor and the second transistor is a p-channel MOS transistor.

8. A switch circuit comprising:
a switch including a first transistor and a second transistor, the first transistor having a body and being coupled to the second transistor in parallel to form a common source and a common drain, the common source defining an input node and the common drain defining an output node;
a first body grabbing circuit coupled to the body of the first transistor and being arranged to couple the body of the first transistor to the input node when the first and second transistors receive a turn-on voltage signal such that a first body effect is eliminated in the first transistor; and
the first transistor is a p-channel MOS transistor and the second transistor is an n-channel MOS transistor.

9. The switch circuit as recited in claim 2, wherein the third and fourth transistors are p-channel MOS transistors.

10. The switch circuit as recited in claim 9, wherein the first transistor is a p-channel MOS transistor.

11. The switch circuit as recited in claim 2, wherein the third and fourth transistors are n-channel MOS transistors.

12. The switch circuit as recited in claim 11, wherein the first transistor is an n-channel MOS transistor.

13. The switch circuit as recited in claim 2, wherein the turn-on signal further comprises a first turn-on signal and a second turn-on signal, wherein the first transistor receives the first turn-on signal and the second transistor receives the second turn-on signal simultaneously.

14. The switch circuit as recited in claim 2, wherein the fourth transistor turns on to couple the body of the first transistor to the input node when the third transistor turns off in response to the turn-off voltage signal.

15. The switch circuit as recited in claim 2, wherein the third transistor turns off in response to the turn-off voltage signal after the first and second transistors receive the turn-on voltage signal.

16. The switch circuit as recited in claim 15, wherein the fourth transistor turns on after the third transistor turns off.

17. The switch circuit as recited in claim 16, wherein the first, second, third, and fourth transistors change states simultaneously.

18. The switch circuit as recited in claim 16, wherein the third and fourth transistors change states simultaneously.

19. The switch circuit as recited in claim 2, wherein the switch circuit is used in a switched capacitor circuit.

20. The switch circuit as recited in claim 2, wherein the switch circuit operates at a voltage of less than 5 volts.

21. A switch circuit comprising:
and second switching means for transmitting an input signal to an output node, the first switching means having a body, the second switching means having a body, the first switching means receiving the input signal at an input node, the first and second switching means being coupled at the input and output nodes;
first body coupling means for coupling the body of the first switching means to the input node when the first and second switching means receive a turn-on voltage signal such that a first body effect on the first switching means is eliminated and second body coupling means connected to the body of the second switching means for coupling the body of the second switching means to the input node when the first and second switching means receive the turn-on voltage signal such that a second body effect in the second switching means is substantially eliminated.

22. The switch circuit as recited in claim 21, wherein the first body coupling means further comprises:

third switching means for coupling the body of the first switching means to a first voltage level when the first switching means receives a turn-off voltage signal; and fourth switching means for coupling the body of the first switching means to the input node when the first switching means receives the turn-on voltage signal.

23. The switch circuit as recited in claim 21, wherein the second body coupling means further comprises:

a fifth switching means coupled to the body of the second switching means and being arranged to couple the body of the second switching means to a second voltage level when the second switching means receives a turn-off voltage signal; and a sixth switching means coupled between the body of the second switching means and the input node, the sixth switching means being arranged to couple the body of the second switching means to the input node when the second switching means receives the turn-on voltage signal.

24. The switch circuit as recited in claim 21, wherein the switch circuit is a CMOS switch circuit.

25. The switch circuit as recited in claim 21, wherein the first and second switching means are MOS transistors.

26. The switch circuit as recited in claim 21, wherein the first switching means is an n-channel MOS transistor and the second switching means is a p-channel MOS transistor.

27. The switch circuit as recited in claim 21, wherein the first switching means is a p-channel MOS transistor and the second switching means is an n-channel MOS transistor.

28. The switch circuit as recited in claim 21, wherein the third and fourth switching means are p-channel MOS transistors.

29. The switch circuit as recited in claim 28, wherein the first switching means is a p-channel MOS transistor.

30. The switch circuit as recited in claim 22, wherein the third and fourth switching means are n-channel MOS transistors.

31. The switch circuit as recited in claim 21, wherein the first switching means is an n-channel MOS transistor.

32. The switch circuit as recited in claim 21, wherein the turn-on signal further comprises a first turn-on signal and a second turn-on signal, wherein the first switching means receives the first turn-on voltage signal and the second switching means receives the second turn-on simultaneously.

33. The switch circuit as recited in claim 22, wherein the fourth switching means turns on to couple the body of the first switching means to the input node when the third switching means turns off in response to the turn-off voltage signal.

34. The switch circuit as recited in claim 22, wherein the third switching means turns off in response to the turn-off voltage signal after the first and second switching means receive the turn-on signal.

35. The switch circuit as recited in claim 34, wherein the fourth switching means turns on after the third switching means turns on.

36. The switch circuit as recited in claim 35, wherein the first, second, third, and fourth switching means change states simultaneously.

37. The switch circuit as recited in claim 35, wherein the third and fourth switching means change states simultaneously.

38. The switch circuit as recited in claim 21, wherein the switch circuit is used in a switched capacitor circuit.

39. A method for eliminating body effect on a first transistor having a body, a source, drain, and a gate, the method comprising:

receiving an input signal at the source;

applying a first voltage to the first transistor;

coupling the body of the first transistor to the source, said coupling through a body grabbing circuit having a third transistor, such that the voltage at the body of the first transistor is at the same voltage as the source of the first transistor; and taking an output voltage at the drain of the first transistor.

40. The method as recited in claim 39, wherein the body coupling further comprises:

coupling the body of the first transistor to a first voltage level when a turn-on voltage signal is received; and coupling the body of the first transistor to the source.

41. The method as recited in claim 39, wherein the first transistor is used in a CMOS switch circuit.

42. The method as recited in claim 39, wherein the first transistor is a CMOS transistor.

43. The method as recited in claim 41, wherein the CMOS switch circuit comprises a second transistor coupled in parallel to the first transistor to form a common source node and a common drain node, the common source node defining an input node and the common drain node defining an output node.

* * * * *

UNITED STATES PATENT AND TRADEMARK OFFICE
CERTIFICATE OF CORRECTION

PATENT NO.    : 6,008,689
DATED         : December 28, 1999
INVENTOR(S)   : Stephen C. Au et al.

It is certified that error appears in the above-identified patent and that said Letters Patent is hereby corrected as shown below:

Column 10,
Line 60, reads "and second switching means for transmitting an input"; it should read -- first and second switching means for transmitting an input --;

Column 1,
Line 13, reads "products. For example, modem products such as computers"; it should read -- products. For example, modern products such as computers --;
Line 66, reads "depletion region between the substrate and the sourcc/drain"; it should read -- depletion region between the substrate and the source/drain --;

Column 2,
Line 5, reads "voltage $V_{TH,NOMOS}$ of the NMOS transistor as the reverse"; it should read -- voltage $V_{TH,NMOS}$ of the NMOS transistor as the reverse --;

Column 3,
Line 51, reads "The accompanying drawings, which arc incorporated in"; it should read -- The accompanying drawings, which are incorporated in --;

Column 4,
Line 28, reads "grabbing circuit that tics a body of a transistor in accordance"; it should read -- grabbing circuit that ties a body of transistor in accordance --;

Column 5,
Line 36, reads "Accordingly, the PNjunctions in the transistor M2 are not"; it should read
-- Accordingly, the PN junctions in the transistor M2 are not --;
Line 59, reads "return to the original offstate oftime t1. In this state, the"; it should read -- return to the orignal off state of time t1. In this state, the --;

UNITED STATES PATENT AND TRADEMARK OFFICE
CERTIFICATE OF CORRECTION

PATENT NO. : 6,008,689
DATED : December 28, 1999
INVENTOR(S) : Stephen C. Au et al.

It is certified that error appears in the above-identified patent and that said Letters Patent is hereby corrected as shown below:

<u>Column 8,</u>
Line 26, reads "transistor MI at node 408 while the drain of the transistor M5"; it should read -- transistor M1 at node 408 while the drain of the transistor M5 --;
Line 58, reads "failure in modem sub-micron silicon process"; it should read -- failure in modern sub-micron silicon process --;

Signed and Sealed this

Twenty-first Day of May, 2002

Attest:

JAMES E. ROGAN
Attesting Officer
Director of the United States Patent and Trademark Office